US006545303B1

(12) United States Patent
Scheffer

(10) Patent No.: US 6,545,303 B1
(45) Date of Patent: Apr. 8, 2003

(54) METHOD TO INCREASE CONVERSION GAIN OF AN ACTIVE PIXEL, AND CORRESPONDING ACTIVE PIXEL

(75) Inventor: Danny Scheffer, Clinge (NL)

(73) Assignee: Fillfactory, Mechelen (BE)

( * ) Notice: Subject to any disclaimer, the term of this patent is extended or adjusted under 35 U.S.C. 154(b) by 0 days.

(21) Appl. No.: 09/993,821

(22) Filed: Nov. 6, 2001

(51) Int. Cl.[7] .................. H01L 29/04; H01L 31/20; H01L 31/036; H01L 31/062; H01L 31/113
(52) U.S. Cl. .................. 257/290; 257/59; 257/72; 257/289; 257/291; 257/292
(58) Field of Search .................. 257/59, 72, 290, 257/291

(56) References Cited

U.S. PATENT DOCUMENTS

| | | | | |
|---|---|---|---|---|
| 5,608,243 A | * | 3/1997 | Chi et al. | 257/249 |
| 5,780,884 A | * | 7/1998 | Kumagai et al. | 257/236 |
| 5,904,493 A | * | 5/1999 | Lee et al. | 438/57 |
| 5,920,092 A | * | 7/1999 | Watanabe | 257/292 |
| 5,998,818 A | * | 12/1999 | Kumagai et al. | 257/291 |
| 6,023,293 A | * | 2/2000 | Watanabe et al. | 348/294 |
| 6,100,556 A | * | 8/2000 | Drowley et al. | 257/292 |
| 6,339,248 B1 | * | 1/2002 | Zhao et al. | 257/461 |
| 6,372,537 B1 | * | 4/2002 | Lee et al. | 438/48 |
| 6,225,670 B1 | * | 5/2002 | Dierickx | 257/431 |
| 6,297,070 B1 | * | 10/2002 | Lee et al. | 438/57 |
| 6,486,521 B2 | * | 11/2002 | Zhao et al. | 257/443 |
| 6,333,204 B1 | * | 12/2002 | Hook et al. | 438/48 |
| 2002/0100915 A1 | * | 8/2002 | Hynecek | 257/158 |

* cited by examiner

*Primary Examiner*—Eddie Lee
*Assistant Examiner*—Jesse A Fenty
(74) *Attorney, Agent, or Firm*—Barnes & Thornburg

(57) ABSTRACT

The present invention provides an active pixel including a semiconductor layer (5) having dopants of a first conductivity type, wherein said semiconductor layer (5) comprises a first region (1) and a second region (2) both having dopants of a second conductivity type, said first region (1) and said second region (2) being adapted for collecting charge carriers in said semiconductor layer (5) generated by electromagnetic radiation, said first region (1) having an area and a boundary of this area, said semiconductor layer (5) further comprising a third region (3) having dopants of the first conductivity type at a higher doping level than the semiconductor layer (5), the third region (3) forming a barrier for substantially impeding the diffusion of said charge carriers to said second region (2). Over a part of its boundary, the first region (1) is separated from the third region (3) by a zone of the semiconductor layer (5) for creation of a depletion zone (9). The effect of the separation is to improve the gain of the device.

11 Claims, 3 Drawing Sheets

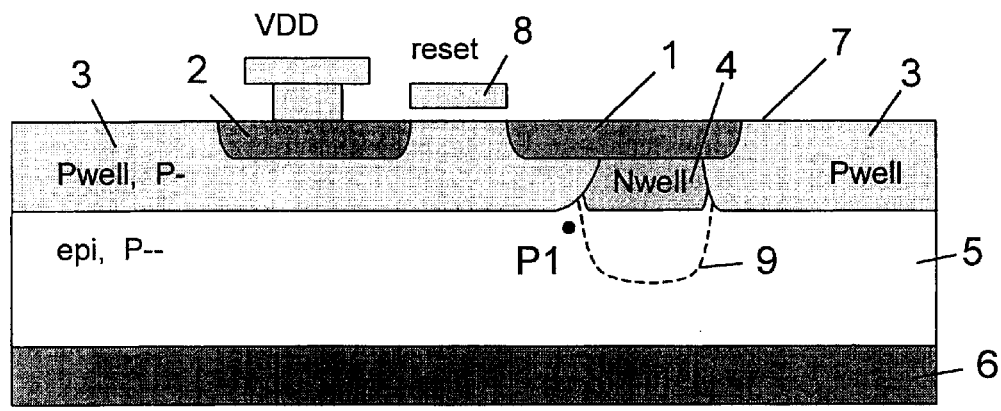
Fig. 1 - Prior art
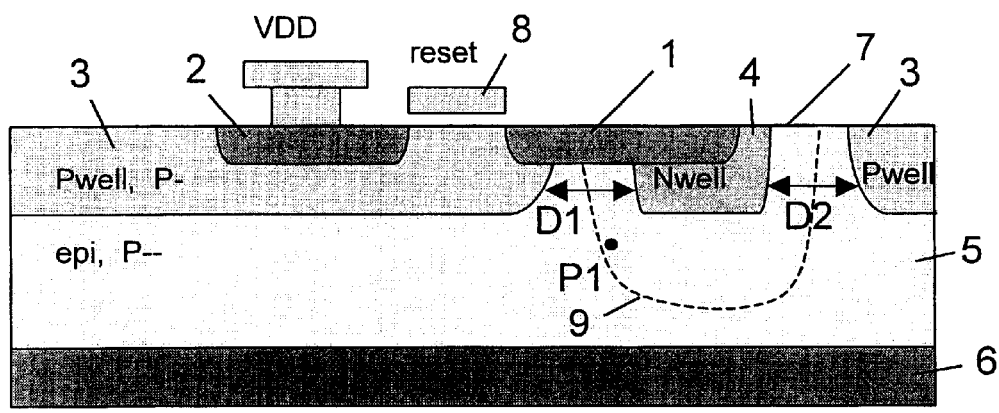
Fig. 2
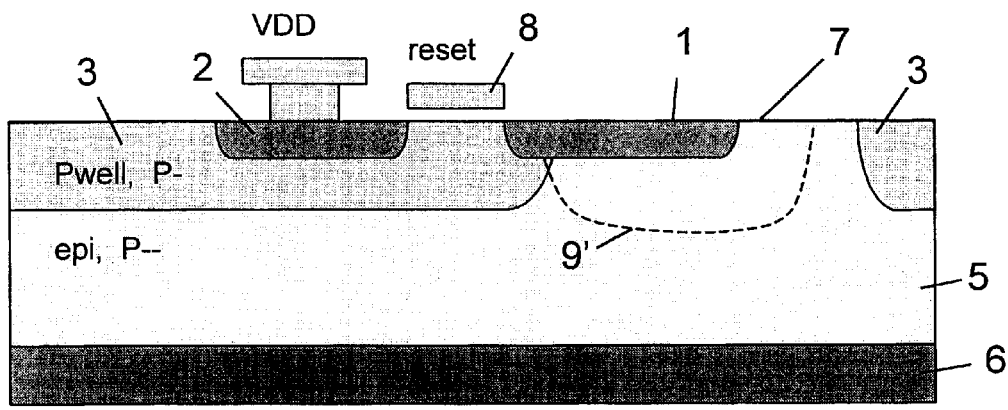
Fig. 3

METHOD TO INCREASE CONVERSION GAIN OF AN ACTIVE PIXEL, AND CORRESPONDING ACTIVE PIXEL

TECHNICAL FIELD OF THE INVENTION

The present invention relates to the field of semiconductor based detectors for electromagnetic radiation. In particular active pixels for detecting electromagnetic radiation with a high fill factor or high sensitivity are disclosed as well as a detector comprising an array of such active pixels. The present invention also relates to a method of manufacturing such pixels and detectors.

BACKGROUND OF THE INVENTION

Semiconductor based sensors and devices for detecting electromagnetic radiation are known in the art. Examples of such sensors are disclosed in WO 93/19489 and in EP-0739039. These sensors are implemented in a semiconductor substrate in CMOS- or MOS technology. In these sensors, the regions adapted for collecting charge carriers being generated by the radiation in the semiconductor substrate are forming a p-n or a n-p junction with the substrate that is of a n type conductivity or p type conductivity respectively. Such junctions are called collection junctions. Among the image sensors implemented in CMOS- or MOS-technology, CMOS or MOS image sensors with passive pixels and CMOS or MOS image sensors with active pixels are distinguished. The sensors of WO 93/19489 and EP-0739039 are active pixel sensors.

An active pixel is configured with means integrated in the pixel to amplify the charge that is collected on the light sensitive element or component in the pixel. Passive pixels do not have said means and require a charge-sensitive amplifier that is not integrated in the pixel and is connected with a long line towards the pixel. Due to the additional electronics in the active pixel, an active pixel image sensor may be equipped to execute more elaborated functions, which can be advantageous for the performance of the imaging device or system based on the sensor. Said functions can include filtering, operation at higher speed or operation in more extreme illumination conditions. It remains however a main drawback of active pixel CMOS or MOS image sensors, and to a lesser extent also of passive pixel sensors, that a significant part of the surface of the pixel is used for readout circuitry.

It is known that the charge sensitive volume of a p-n or n-p junction is larger than the depletion layer of the junction. In fact all charges generated within a so-called recombination length from the collection junction have a chance of diffusing to that junction and of being collected. Based on this mechanism it is possible to make a sensor with a small junction and yet a large photosensitive volume. Photosensors can be made with junctions of 3 by 2 $\mu$m and with a recombination length of 15 $\mu$m. Thus such detector has an apparent front size or photosensitive region of 30 $\mu$m diameter. However if a non-related electronic circuitry such as readout circuitry is placed in the neighbourhood of such collection junction, part of the charges that otherwise would have reached the collection junction will be collected by junctions or components of the readout circuitry. The charge carriers generated by light falling on the regions of the detector that are used for readout circuitry therefore are mainly collected by the junctions of this readout circuitry. The area taken by the readout circuitry in the pixels therefore is lost for collecting the radiation and this is essentially the reason for the low fill factor or low sensitivity of active pixel based sensors.

In U.S. Pat. No. 6,225,670 a semiconductor based detector for radiation is disclosed. Such a detector is also represented in FIG. 1. It has a barrier 3 between the radiation sensitive volume 5 in the semiconductor substrate 6 and the regions 2 and junctions with readout circuitry, and no or a lower barrier 4 between the radiation sensitive volume 5 in the semiconductor substrate 6 and the regions 1 and junctions adapted and meant for collecting the charge carriers being generated by the radiation. The region forming the barrier 3 in between the radiation sensitive volume 5 wherein charges are created and the unrelated electronics 2 of the readout circuitry can have dopants of the same conductivity type as the radiation sensitive volume 5, for example a p-well in a p type substrate. The region 4 generating no barrier may be a region of inverse conductivity type as the conductivity type of the substrate, for example a n-well in a p type substrate. Such a pixel has a higher fill factor than a pixel having no barrier region 3.

It is an object of the present invention to provide sensors and methods of making the same which provide improved sharpness of image without increasing the noise content of the image.

SUMMARY OF THE INVENTION

Surprisingly it has been found by the present inventor that the fill factor of an active pixel of the kind shown in U.S. Pat. No. 6,225,670 can be increased still further by providing a distance between the region forming the barrier in between the radiation sensitive volume wherein charges are created and the electronic components of the readout circuitry on the one hand, and a region which is located at least partly under a charge collection region on the other hand.

Accordingly, the present invention provides an active pixel including a semiconductor layer having a surface and having dopants of a first conductivity type, wherein said semiconductor layer comprises a first region and a second region both having dopants of a second conductivity type, said first region and said second region being adapted for collecting charge carriers in said semiconductor layer generated by electromagnetic radiation, said first region having an area and a boundary of this area, said semiconductor layer further comprising a third region having dopants of the first conductivity type at a higher doping level than the semiconductor layer, the third region forming a barrier for substantially impeding the diffusion of said charge carriers to said second region, wherein over a part of its boundary, the first region is separated from the third region by a zone of the semiconductor layer for creation of a depletion layer or zone and a diffusion layer or zone at, or touching, the surface. The electromagnetic radiation can be all forms of light, X-rays and cosmic or nuclear particles. The semiconductor layer may be an epitaxial layer.

A fourth region may be provided having dopants of said second conductivity type and at least partially overlapping said first region, wherein the fourth region is over a part of its boundary separated from the third region by a zone of the semiconductor layer.

The present invention also provides an array of active pixels, each active pixel comprising a semiconductor layer having a surface and having dopants of a first conductivity type, wherein said semiconductor layer comprises a first region and a second region both having dopants of a second conductivity type, said first region and said second region being adapted for collecting charge carriers being generated by electromagnetic radiation in said semiconductor layer, said first region having an area and a boundary, said semiconductor layer further comprising a third region having dopants of the first conductivity type at a higher doping level than the semiconductor layer, the third region forming a barrier for substantially impeding the diffusion of said charge carriers to said second region, wherein over a part of its boundary, the first region of a pixel of interest is separated from the third region of a neighbouring pixel by a zone of the semiconductor layer for creation of a depletion layer or zone and a diffusion layer or zone at, or touching, the surface. For the best performance, the separation should at least be equal to the width of the depletion layer, which a person skilled in the art is able to calculate for a given technology. The width of this depletion layer depends on the concentration of the layer in which the depletion layer is created. Any width larger than the width of the depletion layer will not further reduce the pixel capacitance, but it might improve the sharpness. A separation smaller than the width of the depletion layer also reduces the pixel capacitance, but not as much as a separation with a width equal to the width of the depletion layer.

Within the array each active pixel can furthermore be provided with a fourth region having dopants of said second conductivity type and at least partially overlapping said first region, wherein the fourth region is over a part of its boundary separated from the third region by a zone of the semiconductor layer.

Each pixel or the array of pixels is preferably a MOS based pixel structure.

The present invention also provides a method to increase conversion gain of an active pixel including a semiconductor layer having dopants of a first conductivity type, said semiconductor layer comprising a first region and a second region both having dopants of a second conductivity type, said first region and said second region being adapted for collecting charge carriers being generated by electromagnetic radiation in said semiconductor layer, said semiconductor layer further comprising a third region having dopants of the first conductivity type at a higher doping level than the semiconductor layer, the third region forming a barrier for substantially impeding the diffusion of said charge carriers to said second region, the method comprising a step of physically separating the third region and the first region by a region of the semiconductor layer.

The present invention may also provide a method for manufacturing an active pixel comprising the steps of: providing a semiconductor layer having dopants of a first conductivity type, providing in said semiconductor layer a first region and a second region both having dopants of a second conductivity type, said first region having an area and a boundary of this area, further providing in said semiconductor layer a third region having dopants of the first conductivity type at a higher doping level than the semiconductor layer, and forming the first and third regions such that over a part of its boundary, the first region is separated from the third region by a zone of the semiconductor layer.

An active pixel according to the present invention provides a lower capacitance and a larger conversion gain than prior art active pixels. Sharper images can be produced compared with conventional devices.

Other features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 1 schematically shows a vertical cross-section of an active pixel according to the prior art.

FIG. 2 schematically shows a vertical cross-section of an active pixel according to a first embodiment of the present invention, a distance being present between an n-well implant and a p-well implant.

FIG. 3 schematically shows a vertical cross-section of an active pixel according to a second embodiment of the present invention, wherein no n-well implant is present.

Figure 4:
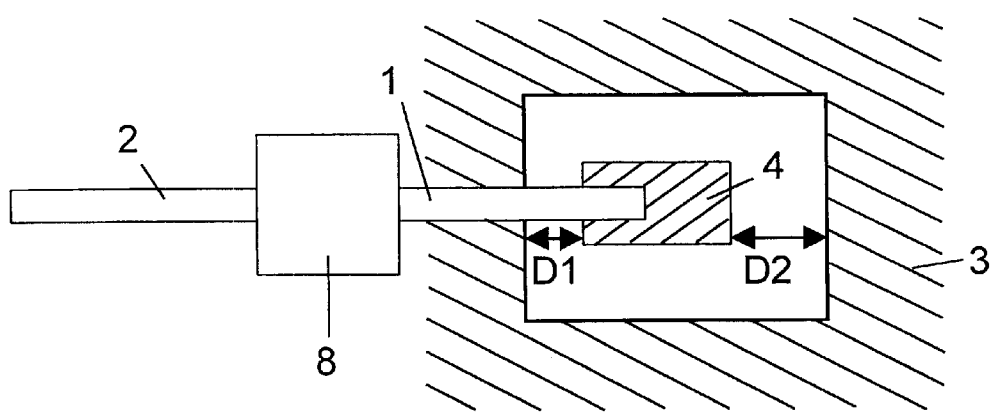
FIG. 4 shows a top view of a layout of the active pixel of FIG. 2.

In the different figures, the same reference figures refer to the same or analogous elements.

DESCRIPTION OF THE ILLUSTRATIVE EMBODIMENTS

The present invention will be described with respect to particular embodiments and with reference to certain drawings but the invention is not limited thereto but only by the claims. The drawings described are only schematic and are non-limiting.

FIG. 2 illustrates a first embodiment of an active pixel according to the present invention. In the example being described, it is assumed that the semiconductor substrate is of a p type conductivity. It will be appreciated by a skilled person in the art that the present invention also includes within its scope equivalent structures that have a semiconductor substrate of a n type conductivity. Also other equivalent embodiments will be obvious for the person of skill in the art, the spirit and scope of the present invention being limited only by the terms of the appended claims.

FIG. 2 schematically shows part of a pixel structure, e.g. an active pixel structure with the semiconductor substrate 6 having a p type doping. A p– layer or region 5 is defined in said substrate 6. The substrate 6 can be of a uniform p– or p++ doping either in alternate embodiments. The p– layer 5 can be defined by diffusion or by ion implantation or epitaxial growth or other techniques known in CMOS based processing. The p– layer 5 has a surface 7. An additional p+ layer or region 3 is defined on or in the p– layer/substrate 5. The p+ region 3 can be defined by diffusion or by ion implantation or epitaxial growth or other techniques known in CMOS based processing. In the p+ region 3 a first region 1 and a second region 2 are defined. These first and second regions 1, 2 are of an n type doping. These first and second regions 1, 2 can be defined by ion implantation or diffusion or other techniques known in CMOS based processing. These first and second regions 1, 2 form a junction with the p type based regions and/or substrate. The first region 1 is a collection junction for collecting the charge carriers being generated by radiation in the substrate 6 and/or p– region 5. The radiation may be any type of radiation e.g. all forms of light including infra-red and ultraviolet as well as the optical spectrum, high energy electromagnetic rays such as X-rays and cosmic and nuclear particles. Said collection junction 1 has an enhanced collection for charge carriers that are generated in the radiation sensitive volume 5 underneath other electronic components. Such functionality is made by means of an electrostatic barrier, that is formed at the interface of the volume 5 and a region 3 with the same conductivity type as said volume 5 underneath said other electronic components. The barrier prevents the charge carriers which are generated underneath said other electronic components from diffusing into the junctions 2 or structures of said other electronic components. According to the example, the collection junction 1 is a photodiode. The second region 2 is a junction being part of readout circuitry for processing the signals being generated by the charge carriers being collected by said first region 1. An additional, optional n type fourth region 4 can be defined and can overlap completely or partially said first region 1. This fourth region 4 extends from said first region 1 to said p-layer 5 and/or to said substrate 6. This fourth region 4 by preference is defined by a deep ion implantation step but may also be defined by other techniques known in CMOS based processing. The third region 3 and the fourth region 4 are such that there is a distance D1 between them, D1 being larger than zero. Also between the fourth region 4 of a pixel, and the third region 3 of a neighbouring pixel there is a distance D2, D2 being larger than zero.

Conventionally, the third and fourth regions are produced by using a single mask so that their boundaries are abutting. In accordance, with the present invention this is no longer the case. It is therefore preferred to use two separate masks to define the third and fourth regions in accordance with an embodiment of the present invention.

By increasing the distances D1, D2 between the p-well layer 3 and the n-well layer 4, or thus by forming a depletion layer or zone and a diffusion layer or zone at, or touching, the surface, the diffusion zone is now touching the surface, so that the effective volume for diffusion is larger, and the diode capacitance is lower. The peripheral parasitic capacitance of the junction n-well region and the p-well region is thus minimised by extending the size of the depletion layer around the n-well photodiode. The capacitance of a photodiode node is determined by the capacitance of the n-well plug 4 to the epitaxial layer (area) 5 and to the p-well (perimeter) 3. By removing the p-well 3 in the direct environment of the n-well plug 4; the perimeter capacitance of the plug 4 becomes negligible. This technique therefore significantly reduces the total photodiode node capacitance and thus increases the conversion gain (charge to voltage conversion) proportionally. An increased sensitivity is thus obtained.

A top view of the layout of an active pixel as described in FIG. 2, is shown in FIG. 4. A hole is made in a p-well implant 3, and in this hole an n-well implant 4 is made. The junction 1 in FIG. 2 forms the source of a reset transistor, and junction 2 forms the drain thereof. Between the source 1 and the drain 2, a gate 8 is applied.

Although the embodiment above has been described with reference to a fourth region comprising an n-well implant, the present invention includes any method of providing a depletion layer. For example, FIG. 3 shows a second embodiment according to the present invention, in which no n-well implant (as n-well implant 4 in FIG. 2) is present. A depletion layer 9' for region 1 is shown in FIG. 3. Also a combination of an implanted n-well and an induced n field is included within the scope of the present invention (however, not represented in any of the drawings).

Compared with FIG. 1, the depletion layers 9 in the embodiments of the present invention are wider (see FIGS. 2 and 3), so that a more efficient charge collection takes place. In the prior art architecture as shown in FIG. 1, the depletion layer 9 is mainly in the vertical direction, in the embodiments according to the present invention, the depletion layer also extends horizontally. A charge present at location P1 in FIG. 1 can diffuse in various directions and may move towards an n-well of a neighbouring pixel. If this occurs then light received for one pixel is recorded on another pixel resulting in a smearing of the image. In any of the embodiments of the present invention, however, a charge present at location P1 (as shown in FIG. 2) will be attracted by the depletion layer of the n-well of that pixel and go to that junction. Lateral movement of charges is reduced. There is thus a larger and better zone to collect charges. This means that charges generated in a pixel will less likely to be collected by another pixel than was the case in prior art architectures. This leads to a sharper image with less blurring or smearing.

Figure 5:
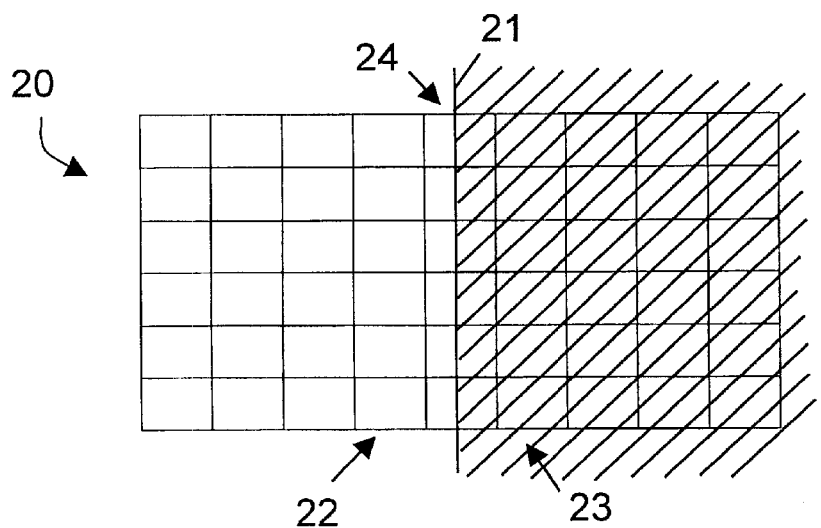
FIG. 5 shows an array of pixels according to the present invention, over which a black to white transition (shadow) is moved in steps.
Figure 6A:
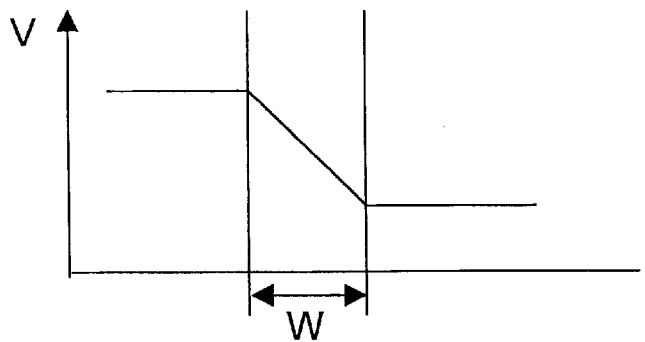
FIG. 6(a) shows an expected graph of the measured voltage in function of the pixel position in case of a black to white transition as in FIG. 5.
Figure 6B:
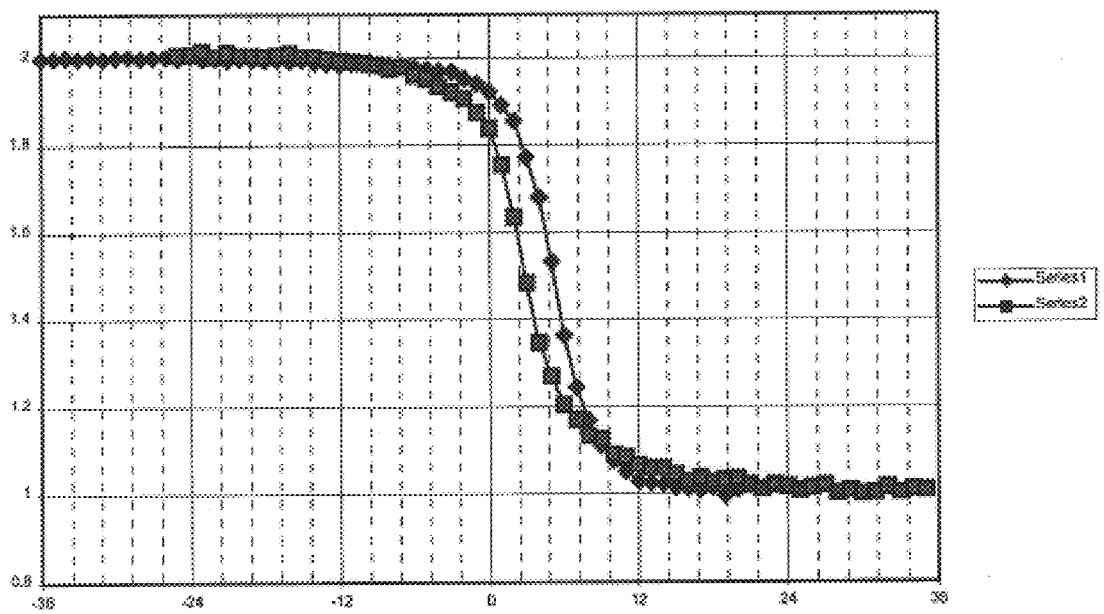
FIG. 6(b) shows a measured graph in which series 1 is produced by a sensor in accordance with the present invention whereas series 2 is produced with a conventional sensor.

An array 20 of n by m pixels according to the present invention is made, as shown in FIG. 5. A black to white transition 21 is moved over the array 20 of pixels in steps of e.g. 1 $\mu$m, and the output voltage for each of the pixels of the array 20 is measured. A graph as in FIG. 6 is obtained, wherein the transition from black to white would be completed over 1 pixel width W. Theoretically, the graph is expected to show sharp edges, i.e. a pixel of row 22 as shown in FIG. 5 is white, a pixel of row 23 is black, and a pixel of row 24 has a value which is in between white and black. If measurements are done on a real array 20 of pixels this is in fact not the case. FIG. 6b, shows actual measured data where data series 2 comes from measurements carried out on a conventional device, and data series 1 comes from measurements carried out on a device according to the present invention. The graphs in FIG. 6b show measurement results, a response received from a pixel, in function of displacement with respect to the black/white transition as shown in FIG. 5 (in $\mu$m). There are no perfect sharp edges. The difference between the results from data series 1 and the results from data series 2 can be explained by taking into account the smaller capacitance obtained by separating the p-well implant and the n-well implant. The conventional formula $$V = \frac{Q}{C}$$

shows that more voltage will be obtained for the same charge Q. By separating the p-well implant from the n-well implant, the capacitance may be reduced, e.g. to one half for instance, or even more. With reference to FIG. 6a, W (the width of the black/white transition 21 as seen by the array 20 of pixels) gets smaller according to the present invention. Hence, the image gets sharper. To improve sharpness algorithms are known which attempt to steepen the response curve of data series 2 in FIG. 6b by signal processing. If an algorithm to sharpen up a conventional image would be applied, then noise is also generated by such an algorithm and can become visible in the image, which is not the case with the solution according to the present invention. Hence, the present invention provides sharper images without degradation of noise content in the image.

While the invention has been shown and described with reference to preferred embodiments, it will be understood by those skilled in the art that various changes or modifications in form and detail may be made without departing from the scope and spirit of this invention.

What is claimed is:

1. An active pixel including a semiconductor layer (5) having a surface (7), and having dopants of a first conductivity type, wherein said semiconductor layer (5) comprises
a first region (1, 4) having dopants of a second conductivity type and being adapted for collecting charge carriers generated in said semiconductor layer (5) by electromagnetic radiation, said first region (1, 4) having an area and a boundary of this area, and a second region (2) having dopants of a second conductivity type, said second region (2) being adapted for collecting charge carriers collected in the first region (1, 4), said semiconductor layer (5) further comprising a third region (3) having dopants of the first conductivity type at a higher doping level than the semiconductor layer (5), the third region (3) forming a barrier for substantially impeding the diffusion of said charge carriers from said semiconductor layer (5) to said second region (2), wherein over a part of its boundary, the first region (1, 4) is separated from the third region (3) by a zone of the semiconductor layer (5) having a diffusion layer at, or touching, the surface (7).

2. An active-pixel according to claim 1, wherein the first region includes a fourth region (4) having dopants of said second conductivity type, wherein the fourth region (4) is over a part of its boundary separated from the third region (3) by a zone of the semiconductor layer (5).

3. A MOS based pixel structure for detecting light comprising a plurality of active pixels as recited in claim 1.

4. An array of active pixels, each active pixel comprising a semiconductor layer (5) having a surface (7) and having dopants of a first conductivity type, wherein said semiconductor layer (5) comprises a first region (1, 4) having dopants of a second conductivity type and being adapted for collecting charge carriers being generated by electromagnetic radiation in said semiconductor layer (5), said first region (1, 4) having an area and a boundary, and a second region (2) having dopants of a second conductivity type, said second region (2) being adapted for collecting charge carriers collected in the first region (1, 4), said semiconductor layer (5) further comprising a third region (3) having dopants of the first conductivity type at a higher doping level than the semiconductor layer (5), the third region (3) forming a barrier for substantially impeding the diffusion of said charge carriers from said semiconductor layer (5) to said second region (2), wherein over a part of its boundary, the first region (1, 4) of a pixel of interest is separated from the third region (3) of a neighbouring pixel by a zone of the semiconductor layer (5) having a diffusion zone at, or touching, the surface (7).

5. An array of active pixels according to claim 4, the depletion layer having a width, wherein the separation is larger than the width of the depletion layer (9).

6. An array of active pixels according to any of claim 4, wherein the first region of each active pixel includes a fourth region (4) having dopants of said second conductivity type, wherein the fourth region (4) is over a part of its boundary separated from the third region (3) by a zone of the semiconductor layer (5).

7. A MOS based pixel structure for detecting light comprising an array of active pixels as recited in claim 4.

8. Method to increase conversion gain of an active pixel including a semiconductor layer (5) having dopants of a first conductivity type, said semiconductor layer (5) comprising a first region (1, 4) and being adapted for collecting charge carriers being generated by electromagnetic radiation in said semiconductor layer (5), and a second region (2) having dopants of a second conductivity type, said second region (2) being adapted for collecting charge carries collected in the first region (1, 4), said semiconductor layer (5) further comprising a third region (3) having dopants of the first conductivity type at a higher doping level than the semiconductor layer (5), the third region (3) forming a barrier for substantially impeding the diffusion of said charge carriers from said semiconductor layer (5) to said second region (2),
the method comprising a step of forming the first and third regions so that the third region (3) and the first region (1, 4) are separated by a portion of the semiconductor layer (5).

9. Method according to claim 8, the depletion layer having a width, wherein the separation is larger than the width of the depletion layer (9).

10. Method for manufacturing an active pixel comprising the steps of
providing a semiconductor layer (5) having dopants of a first conductivity type,
providing in said semiconductor layer (5) a first region (1, 4) and a second region (2) both having dopants of a second conductivity type, said first region (1) having an area and a boundary of this area,
further providing in said semiconductor layer (5) a third region (3) having dopants of the first conductivity type at a higher doping level than the semiconductor layer (5), the third region (3) having a surface, the second region (2) being provided in the surface of the third region (3), and
forming the first and third regions so that, over a part of its boundary, the first region (1) is separated from the third region (3) by a zone of the semiconductor layer (5).

11. Method according to claim 10, further providing in said semiconductor layer (5) a fourth region (4) having dopants of said second conductivity type, the fourth region at least partially overlapping said first region (1), wherein the fourth region (4) is over a part of its boundary separated from the third region (3) by a zone of the semiconductor layer (5).

* * * * *